United States Patent [19]

Kniepkamp

[11] 3,808,470

[45] Apr. 30, 1974

[54] BEAM-LEAD SEMICONDUCTOR COMPONENT

[75] Inventor: Hermann Kniepkamp, Munich, Germany

[73] Assignee: Siemens Aktiengesellschaft, Berlin & Munich, Germany

[22] Filed: Oct. 24, 1972

[21] Appl. No.: 299,754

[30] Foreign Application Priority Data

Oct. 28, 1971 Germany .......................... 2153889

[52] U.S. Cl. .... 317/234 R, 317/234 M, 317/234 N, 317/235 UA

[51] Int. Cl. .......................................... H01l 5/02

[58] Field of Search .......................... 317/234, 235

[56] References Cited

UNITED STATES PATENTS 3,290,565 12/1966 Hastings .......................... 317/234

3,528,090 9/1970 VanLaer .......................... 204/15

*Primary Examiner*—Rudolph V. Rolinec

*Assistant Examiner*—E. Wojciechowicz

*Attorney, Agent, or Firm*—Hill, Sherman, Meroni, Gross & Simpson

[57] ABSTRACT

A beam-lead semiconductor component is, for example, a beam-lead Schottky diode, which includes a Schottky metal-semiconductor contact structure with one additional non-blocking contact structure. The semiconductor structure is formed with regions of different doping levels but of the same conductivity type having an insulating layer thereover which contains openings at at least two points, the two openings being over the regions of the different doping levels respectively and the region of lesser doping being formed in the upper surface of said other region. The regions exposed below said opening are provided with metal layers respectively. Contacts extend down into the openings into electrical contact with said metal layers respectively. These contacts come from correction with beam lead terminals which are provided on the surface of the insulating layer. The beam lead connections extend out from the component so that the semiconductor arrangement can be soldered in a self-supporting fashion directly into circuits. This avoids the occurrence of housing capacitances which do occur, for example, in the case of encapsulated diodes. The contact extending into the opening to the region of higher doping level is spaced from the region of lower doping level, with insulating material being therebetween. An ohmic contact is formed on the underside of the region having the higher doping level.

19 Claims, 13 Drawing Figures

BEAM-LEAD SEMICONDUCTOR COMPONENT

BACKGROUND OF THE INVENTION

1. Field of the Invention

The present invention relates to a semiconductor component with beam-lead connections and includes a Schottky metal-semiconductor contact structure and at least one additional contact structure formed on a semiconductor material having regions of differing doping level of the same conductivity type, the semiconductor material being provided with an insulating layer which contains openings at at least two points extending respectively down to the two regions. The semiconductor material below one of such opening has a different doping level to that located beneath the other opening, and the semiconductor surface at the lower ends of these openings are provided with metal layers on which metal seeding sites are formed. Contacts extend down into the openings from beam lead terminals in connection with the metal layers through the seed material.

2. Description of the Prior Art

Semiconductor components with beam-lead connections are well known. They comprise, for example, a substrate of semiconductor material with an epitaxially grown layer on the substrate, a Schottky metal-semiconductor contact and a further contact has been suggested. In addition, on the overall semiconductor arrangement, an insulating layer is applied which is removed over the actual metal-semiconductor contacts themselves. In a single operation, a metal layer is vaporized on to the actual metal-semiconductor contacts, which layer fills out the opening in the insulating layer and forms connections on the latter. When the connections have an adequate thickness, the vaporizing operation is completed.

One drawback of beam-lead semiconductor elements of this kind resides in the fact that between the surface of the epitaxially grown layer and the metal on the insulating layer, there is formed a capacitance which shunts the actual Schottky metal-semiconductor contact, and this capacitance has a disturbing effect when the contact is in the blocking mode. Beam-lead semiconductor components of this kind are, as a consequence, limited in their application.

SUMMARY OF THE INVENTION

One object of the invention is to provide a beam-lead semiconductor component in which the aforesaid drawback is avoided.

This object is achieved by providing a semiconductor component with beam-lead connections which is characterized in accordance with the invention by having the contacting arrangements provided with seed layers, and in which the insulating layer extends, at the locations where the openings are provided, at least up to the edge of the seed layers; and that on the surface of this insulating layer electrically isolated connections are provided which lead in each case over the insulating layer to the openings; and in that on those surfaces of the seed layers not covered by the insulating layer, as well as on the connections arranged on top of the insulating layer, electrically conductive grown layers are produced so that in each case a connection or terminal is electrically connected to a seed layer.

In accordance with a further development of the invention, a method of manufacturing this kind of beam-lead semiconductor component is provided which is characterized in accordance with the invention in that a layer is epitaxially grown upon a substrate of highly doped semiconductor material; in that a partial area of the epitaxial layer and a part of the substrate underlying this partial area, are removed during later stages of the process; in that to the exposed surface of the substrate of semiconductor material a metal or alloy layer is applied which forms together with the substrate a non-blocking contact; and that to a partial area of the epitaxial layer a metal layer is applied which, with the epitaxial layer, forms a Schottky metal-semiconductor contact; in that subsequently seed layers are applied to the exposed metal layers or to the exposed metal layer and the exposed alloy layer of the non-blocking contact and the Schottky metal-semiconductor contact; in that in a further stage of an process the insulating layer is applied to the entire exposed surface of the epitaxial layer of the semiconductor substrate, of the metal layers or of the metal and alloy layers, insofar as these are not covered by the seed layers, and of the seed layers themselves; and in that the insulating layer is susequently removed over the seed layers, at least sufficiently far in each case to leave a residual marginal zone of the seed layers, or, at the most, sufficiently far to ensure that the areas of the seed layers which are exposed by the insulating layer are in each case the same as the total seed layer areas; in that on the surface of the insulating layer electrically isolated connections or terminals are vaporized which in each case lead over the insulating layer to the exposed areas of the seed crystals; in that in a further stage of the process, first of all, layers are grown galvanically upon the exposed areas of the seed layer; and in that the grown layers, when they project above the plane of the insulating layer and when electrically connected with their associated connections, also grow upon these latter; in that the growth process is stopped when the connections are sufficiently thick; and in that in another stage of the process the semiconductor arrangement is provided at front and rear sides with etch-resistant layers; and in that, finally, in an etching operating all those areas of the semiconductor component which are not covered, are etched away.

The advantages attainable by the present invention comprise, in particular, the fact that both the Schottky metal-semiconductor contact structure and the other contact structure of the beam-lead semiconductor components in accordance with the invention can reliably be electrically connected even when the insulating layer is very thick; and that the parallel capacitance shunting the actual Schottky metal-semiconductor contact, between the surface of the epitaxial layer and the grown layer on the insulating layer, can be kept very small.

The following are the considerations which led to the invention: There is a restriction on the degree to which the shunt capacitance can be reduced by consolidating the insulating layer, in the known beam-lead semiconductor component: firstly, because the vaporized-metal, beyond a specific insulating layer thickness, does not form a cohesive layer between the surface of the insulating layer and the surface of the epitaxially grown layer; and secondly, because the production is of a very small area, accurately dimensioned openings in the insulating layer are very difficult if the layer thickness is large.

Further details of the invention will be apparent from the description and the figures which relate to preferred embodiments of the invention and further developments thereof.

DESCRIPTION OF PREFERRED EMBODIMENTS

Figure 1:
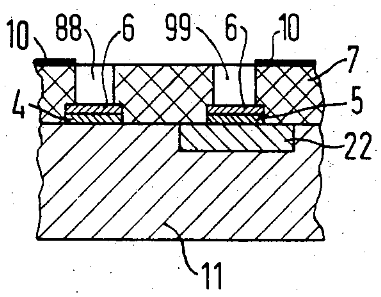
FIG. 1 is a partial sectional view schematically illustrating a beam-lead semiconductor arrangement in accordance with the invention, prior to the growth of the grown layers.

The semiconducting body of a semiconductor component, in accordance with the invention, is shown in FIG. 1, and as shown consists of two regions of the same conductivity type but with differing doping levels. The region carrying the reference 11 is more highly doped than the region 22. The contacting arrangement 4 forms in association with the more highly doped region 11, a preferably non-blocking contact while the metal layer 5 forms with the less highly doped region 22, a Schottky metal-semiconductor contact. Seed layers 6 are applied on the layers 4 and 5. An insulating layer 7 is applied on the top of the seed layers over the full semiconductor arrangement, with the exception of the openings 88 and 99. Connections 10 lead over the insulating layer to these openings.

Figure 2:
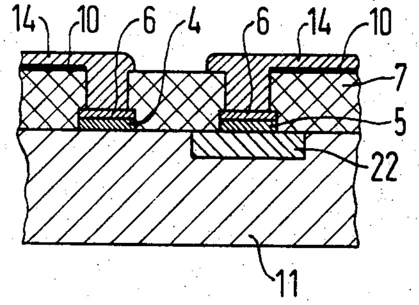
FIG. 2 is a view similar to FIG. 1 which schematically illustrates a semiconductor component in accordance with the invention, after the growth of the grown layers.

In FIG. 2, the layers grown on the seed layer 6 and on the connections 10, are marked 14.

Figure 3:
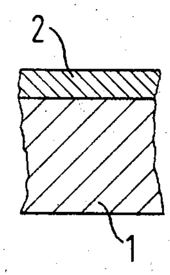
FIGS. 3 to 13 schematically illustrate partial sectional views of the individual stages of the process used to manufacture a slightly different embodiment of a semiconductor component in accordance with the invention, with beam-lead connections or terminals.

In FIG. 3, the more highly doped substrate of semiconductor material, is marked 1. This substrate consists preferentially of a highly doped *n*-type substrate, for example $n^+$-doped gallium-arsenide. A less highly doped layer 2 is epitaxially grown upon this substrate. This epitaxially grown layer is a thin *n*-type layer.

Figure 4:
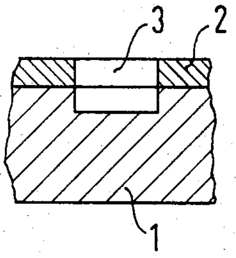

An opening 3 is formed in a part of the epitaxial layer 2 and is also formed in the substrate underlying this part, as is shown in FIG. 4. The production of this opening 3 is preferably achieved by using a photolithographic process followed by etching.

Figure 5:
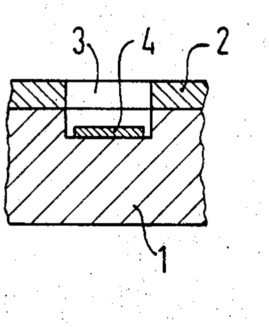

In FIG. 5, a layer 4 is formed on the substrate semiconductor in the opening 3, as illustrated. The layer 4 forms with the substrate semiconductor a non-blocking contact. It will preferably consist of a Gold-Germanium alloy or a Silver-Indium-Germanium alloy. Because, in a later stage of the process, a metal seed layer is to be applied to the layer 4, in one preferred embodiment of a beam-lead semiconductor component, on the layer 4, a chrome or chrome-nickel layer can be applied as an aid to bonding it.

Figure 6:
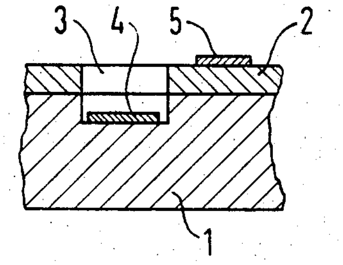

In FIG. 6, a layer 5 is shown as applied to a part of the epitaxially grown layer, preferably by vaporizing it thereon. This layer 5 will preferably be a chrome layer. The layer 5, in association with the epitaxial layer, forms a Schottky metal-semiconductor contact.

Figure 7:
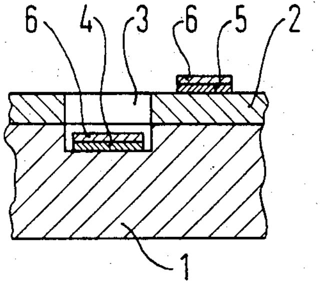

As FIG. 7 shows, the seed layers 6 are applied on the layers 4 and 5 described hereinbefore. Preferentially, the seed layers 6 will consist of silver, gold or nickel, and will be precisely registered with the layers underlying them.

Figure 8:
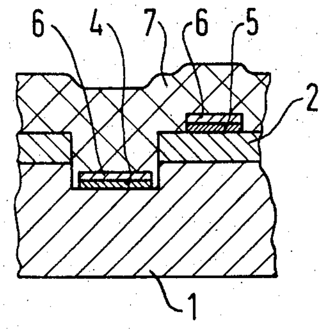

FIG. 8 illustrates the insulating layer being initially applied over the entire exposed surface of the epitaxial layer, over the surface exposed in the opening 3 of the semiconductor substrate, over the surfaces of metal and alloy layers, insofar as these are not covered by the seed layers on top of them, and over the exposed surfaces of the seed layers. The insulating layer is marked 7 and consists of an electrical insulating material such as $SiO_2$, $Si_3N_4$ or $Al_2O_3$. In particular, baked photosensitive varnish can be used as an insulating layer due to the fact that it has a lower dielectric constant than the insulating layers referred to above.

Figure 9:
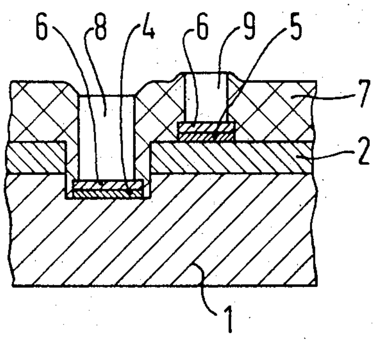

Subsequently, the insulating layer 7, as shown in FIG. 9, is removed from above the seed layers, either leaving a marginal seed layer zone or, preferably, to a maximum extent such that the seed layer area in each case exposed by the insulating layer is the same as the total area of the particular seed layer. The openings formed in the insulating layer and located above these exposed areas of the seed layers, are marked 8 and 9. The opening located above the non-blocking contact structure, is marked 8, while that located above the Schottky metal-semiconductor structure is marked 9.

Figure 10:
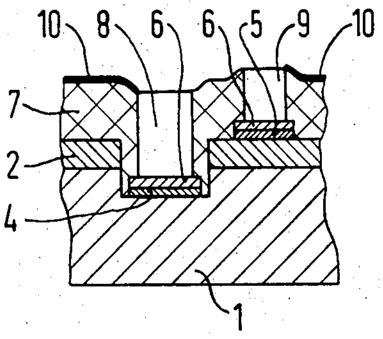

The electrically isolated terminals shown in FIG. 10 and applied on the insulating layer, are marked 10. Preferentially, the metal layers used as connections will be vaporized on and given the requisite structure by use of a photolithographic process. They can consist, for example, of gold, silver or nickel. The terminals 10 are electrically separated from one another and lead over the insulating layer to the opening corresponding to their particular associated contact structures.

Figure 11:
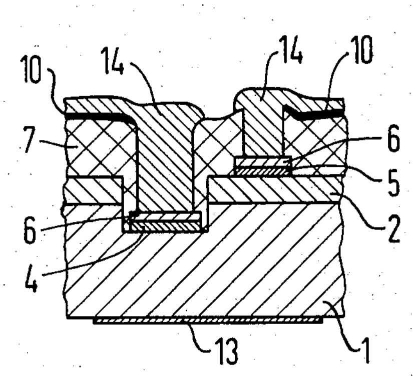

In FIG. 11, the layers grown on the seed layers and upon the connections are marked 14. The production of the grown layers on the surfaces of the seed layers and on the surfaces of the connections will preferably be effected in the following manner: By dipping the semiconductor arrangement shown schematically in FIG. 10 (which arrangement is provided on the surface of the substrate semiconductor opposite to that carrying the metal-semiconductor contact and the Schottky metal-semiconductor contact, with a non-blocking contact 13) in an electrolyte which contains the metal of the seed layer in the ion form, and by suitable poling of the substrate, it is possible to obtain with current flow between the substrate of semiconductor material and an electrode (preferably a platinum electrode) the deposition of layers 14 upon the surface of the seed layer 6.

In the course of the growth process, the grown layers, initially still in the openings formed above the seed layers in the insulating layer, increase in thickness and finally reach the level of the insulating layer. The grown layers 14 come into electrical contact with the connections 10 leading to the openings formed in the insulating layer when they grow to a position above the level of the insulating layer. As soon as this electrical contact between the grown layers and their particular associated connections is established, the grown layers begin to grow on to their associated connections. The connections 10 are consequently consolidated by this method. The growth process is interrupted when the grown layers have satisfactorily consolidated the connection 10. Preferentially, the thickness of the grown layers on the connections will be about 10 microns.

Figure 12:
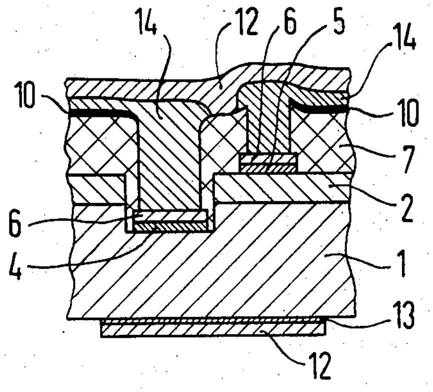

In a further stage of the process, as shown in FIG. 12, the semiconductor arrangement of FIG. 11 is provided at top and bottom with etch-resistant layers 12. These etch-resistant layers will preferably consist of $SiO_2$ or $Al_2O_3$. They must be resistant against etching agents which attack the semiconductor material. By way of etching agents, it is possible to use a solution of $H_2SO_4$, $H_2O_2$ and $H_2O$, the solution containing three parts of $H_2SO_4$, one part of $H_2O_2$ and one part of $H_2O$. Through a terminal etching operation, those parts of the semiconductor arrangement not protected by the etch-resistant layers are etched away.

Figure 13:
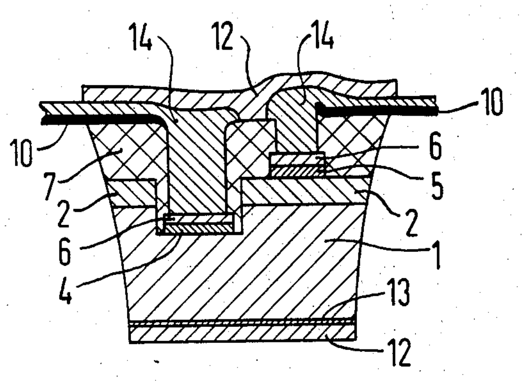

In this fashion, the final beam-lead semiconductor component, shown schematically in FIG. 13, is obtained, and, through the medium of consolidated connections exposed by the etching operation outside the etch-resistant layers, can be directly soldered into circuits. Consequently, the beam-lead semiconductor component need not be encapsulated.

From the above description, it will be apparent that the beam-lead semiconductor component in accordance with the invention consists essentially of a non-blocking contact and of a Schottky metal-semiconductor contact. The connections leading to these contacts are consolidated by grown layers so that the semiconductor arrangement in accordance with the invention can be soldered in self-supporting fashion directly into circuits, it being possible therefore to avoid the occurrence of any housing capacitances, for example, in the case of encapsulated diodes.

In the beam-lead semiconductor component in accordance with the invention, we are dealing with a beam-lead Schottky diode. Using the method in accordance with the invention, other beam-lead semiconductor devices, for example, varactor diodes and mixer diodes can be produced.

Although the invention has been described in connection with the preferred embodiments, it is not to be limited as changes and modifications may be made which are within the full intended scope of the invention as defined by the appended claims.

I claim as my invention:

1. A semiconductor component comprising a semiconductor substrate of relatively high impurity concentration of one type, an epitaxial semiconductor layer formed on said substrate having a relatively low impurity concentration of the same impurity type as said substrate, a layer of insulating material formed on said epitaxial layer, said layer of insulating material having an opening therethrough extending to the upper surface of said epitaxial layer, said insulating layer and said epitaxial layer having an opening extending therethrough to the upper surface of said substrate, a metal layer formed on said epitaxial layer at the base of the first of said openings, a metal layer formed on said substrate at the base of the second of said openings, a metal seed layer formed on each of said metal layers, contacts extending from said seed layer out through said openings, and beam lead connections integrally formed on the upper surface of said insulating layer and overhanging an edge thereof, outer portions of said contacts overlying said beam lead connections and integrally connected thereto.

2. The method of manufacturing a semiconductor component which includes growing an epitaxial layer on a substrate of highly doped semiconductor material, removing a partial area of the epitaxial layer and a part of the substrate underlying this partial area, applying a conductive layer to the exposed surface of said substrate which forms together with the substrate a non-blocking contact, applying to a partial area of the epitaxial layer a conductive layer which with the epitaxial layer forms a Schottky metal-semiconductor contact, forming seed layers on the exposed conductive layers of the non-blocking contact and the Schottky metal-semiconductor contact, forming metal seed layers on said conductive layers, applying an insulating layer to the entire exposed surface of the epitaxial layer and the semiconductor substrate except above said seed layers, forming by vaporization isolated connections on the upper surface of said insulating layer, galvanically growing terminals upon the exposed areas of said seed layers, permitting the growth of said terminals on said seed layers to continue until they project above the plane of said insulating layer and until they electrically connect with and grow upon said isolated connections, and providing on the top and bottom of said semiconductor component etch-resistant layers.

3. A semiconductor component having a substrate of high impurity concentration, a relatively thin epitaxial layer thereon of low impurity concentration and of the same type as said substrate, a relatively thick layer of insulating material covering said epitaxial layer, two openings in said component forming wells, one being from the upper surface of said insulating material down through said insulating material to said epitaxial layer and the second opening being from the upper surface of said insulating material down through said insulating material, through said epitaxial layer and partially into said substrate, a metal layer at the base of each well in intimate contact with the epitaxial layer and the substrate respectively, a metal seed layer on each of said metal layers; a grown terminal on each of said seed layers substantially filling said wells and extending out over an adjacent surface portion of said insulating layer, said terminals being spaced from each other and said insulating layer completely surrounding the portions of said grown terminals in said wells, and also completely surrounding said metal layer and said seed layers.

4. A semiconductor component according to claim 3, in which said metal layer at the base of said first opening and said epitaxial layer form a Schottky diode.

5. A semiconductor component according to claim 3, in which said metal layer at the base of said second opening forms a non-blocking contact.

6. A semiconductor component according to claim 3, in which the under surface of said substrate has an ohmic contact.

7. A semiconductor component according to claim 3, in which the terminal in each of said wells has a cross-sectional area slightly less than the surface area of the respective metal seed layers associated therewith.

8. A semiconductor component according to claim 3, in which said metal layer and said seed layer at the base of said second well being spaced inwardly from the inner wall of said second wall.

9. A semiconductor component with beam-lead connections and with a Schottky metal-semiconductor contact structure and at least one additional contact structure, the semiconductor material exhibiting regions of differing doping level but the same conductivity type, there being provided on the semiconductor material an insulating layer which contains openings at at least two points, the surface of the semiconductor below one such opening having a different doping level to that located beneath the other opening, the higher doped semiconductor surface being provided with a first metal layer overlying the surface at the base of the opening thereabove in intimate contact with the underlying semiconductor material, the lower doped semiconductor surface being provided with a second metal layer overlying the surface at the base of the opening thereabove, a seed layer overlying each of said metal layers respectively, said insulating layer having portions extending at the locations where the openings are provided at least from the base of the openings up to the edge of said seed layer, electrically isolated connections on the surface of said insulating layer which lead over said insulating layer to said openings, and electrically conductive grown terminals on those surfaces of the said seed layers not covered by said insulating layer, said terminals extending up through said openings and out on top of the insulating layer in overlying electrically conductive relation with said electrically isolated connections whereby said electrically isolated connections are electrically connected to said seed layers respectively, the less highly doped region being arranged as a layer on top of the more highly doped region, and the less highly doped region having therein an opening which extends at least down to the underlying more highly doped region, the contacting of the grown terminal and the seed layer being in this opening.

10. A semiconductor component according to claim 9, characterized in that said first layer is a non-blocking contact structure.

11. A semiconductor component according to claim 9, characterized in that on a substrate having a higher doping level, an epitaxially grown layer having a lower doping level is produced.

12. A semiconductor component according to claim 10, characterized in that a gold-germanium alloy layer forms the non-blocking contact structure.

13. A semiconductor component according to claim 10, characterized in that a silver-indium-germanium alloy layer forms the non-blocking contact structure.

14. A semiconductor component according to claim 9, characterized in that said second metal layer is a chrome layer.

15. A semiconductor component according to claim 9, characterized in that said metal layer and the underlying semiconductor provides a Schottky metal-semiconductor diode.

16. A semiconductor component according to claim 9, characterized in that for the seed layers, gold, silver or nickel is used.

17. A semiconductor component according to claim 9, characterized in that for the insulating layer $SiO_2$, $Si_3N_4$ or $Al_2O_3$ is provided.

18. A semiconductor component according to claim 9, characterized in that baked photo-sensitive varnish is used for the insulating layer.

19. A semiconductor component according to claim 9, characterized in that etch-resistant masking layers are provided on the semiconductor arrangement.

* * * * *